(12) United States Patent
Sutardja

(10) Patent No.: US 9,153,337 B2
(45) Date of Patent: Oct. 6, 2015

(54) FATIGUE MANAGEMENT SYSTEM AND METHOD FOR HYBRID NONVOLATILE SOLID STATE MEMORY SYSTEM

(75) Inventor: Pantas Sutardja, Los Gatos, CA (US)

(73) Assignee: Marvell World Trade Ltd., St. Michael (BB)

(*) Notice: Subject to any disclaimer, the term of this patent is extended or adjusted under 35 U.S.C. 154(b) by 1833 days.

(21) Appl. No.: 12/365,455

(22) Filed: Feb. 4, 2009

(65) Prior Publication Data

US 2009/0138654 A1 May 28, 2009

Related U.S. Application Data

(63) Continuation-in-part of application No. 11/952,648, filed on Dec. 7, 2007, now abandoned.

(60) Provisional application No. 61/032,774, filed on Feb. 29, 2008, provisional application No. 60/869,493, filed on Dec. 11, 2006.

(51) Int. Cl.
*G11C 16/34* (2006.01)
*G06F 12/02* (2006.01)

(52) U.S. Cl.
CPC .......... *G11C 16/349* (2013.01); *G06F 12/0246* (2013.01); *G11C 16/3495* (2013.01); *G06F 2212/1036* (2013.01); *G06F 2212/7208* (2013.01); *G06F 2212/7211* (2013.01)

(58) Field of Classification Search
None
See application file for complete search history.

(56) References Cited

U.S. PATENT DOCUMENTS

| 4,638,430 | A | | 1/1987 | Perra et al. |
| 5,737,742 | A | * | 4/1998 | Achiwa et al. ................ 711/103 |
| 6,081,447 | A | | 6/2000 | Lofgren |
| 6,163,773 | A | | 12/2000 | Kishi |
| 6,831,865 | B2 | | 12/2004 | Chang et al. |
| 7,032,087 | B1 | | 4/2006 | Chang |
| 7,397,686 | B2 | | 7/2008 | Takashima et al. |
| 2004/0083333 | A1 | | 4/2004 | Chang et al. |
| 2006/0149896 | A1 | | 7/2006 | Chang et al. |
| 2007/0061502 | A1 | | 3/2007 | Lasser et al. |

(Continued)

FOREIGN PATENT DOCUMENTS

| EP | 0 544 252 A | 6/1993 |
| EP | 0 802 540 A | 10/1997 |
| EP | 1 713 085 A | 10/2006 |
| JP | 2001067881 A | 3/2001 |
| JP | 2001266599 A | 9/2001 |
| WO | 2007029259 A2 | 3/2007 |

OTHER PUBLICATIONS

Jen-Wei Hsieh et al. "Efficient Identification of Hot Data for Flash Memory Storage Systems." Feb. 2006. ACM. ACM Transactions on Storage. vol. 2. pp. 22-40.*

(Continued)

*Primary Examiner* — Nathan Sadler

(57) ABSTRACT

A solid state memory system comprises a first nonvolatile semiconductor memory having a first write cycle lifetime and a first set of physical addresses, and a second nonvolatile semiconductor memory having a second write cycle lifetime and a second set of physical addresses. The first write cycle lifetime is greater than the second write cycle lifetime. The system further comprises a fatigue management module to generate a write frequency ranking for a plurality of logical addresses. The fatigue management module maps each of the plurality of logical addresses to a physical address of the first set of physical addresses or the second set of physical addresses based on the write frequency rankings.

15 Claims, 18 Drawing Sheets

(56) References Cited

U.S. PATENT DOCUMENTS

| | | | |
|---|---|---|---|
| 2007/0233931 A1* | 10/2007 | Tanaka et al. | 711/5 |
| 2007/0260811 A1 | 11/2007 | Merry et al. | |
| 2008/0082726 A1 | 4/2008 | Elhamias | |
| 2008/0140918 A1 | 6/2008 | Sutardja | |
| 2008/0215800 A1* | 9/2008 | Lee et al. | 711/103 |
| 2008/0235432 A1* | 9/2008 | Chen et al. | 711/100 |
| 2008/0235468 A1* | 9/2008 | Chen et al. | 711/154 |
| 2009/0049234 A1* | 2/2009 | Oh et al. | 711/103 |
| 2010/0161880 A1* | 6/2010 | You | 711/103 |

OTHER PUBLICATIONS

Boris Y. Chan et al. "A Framework for Cache Management for Mobile Databases: Design and Evaluation." 2001. Kluwer Academic Publishers. Distributed and Parallel Databases. vol. 10. pp. 23-57.*

Notification of Transmittal of the International Search Report and the Written Opinion of the International Searching Authority, or the Declaration dated Jun. 11, 2008 in reference to PCT/US2007/025312.

Notification of Transmittal of the International Search Report and the Written Opinion of the International Searching Authority, or the Declaration dated May 7, 2009 in reference to PCT/US2009/034960 (13 pgs).

Jen-Wei Hsieh et al.; "Efficient Identification of Hot Data for Flash Memory Storage Systems"; ACM Transaction on Storage, vol. 2, No. 1; Feb. 2006; pp. 22-40.

Korean Office Action for related Korean Application No. 10-2010-7019163 dated Mar. 11, 2015; 7 pages.

Taiwan Office Action for related Taiwan Application No. 098105888 dated Dec. 29, 2014; 11 pages.

Chang, L. and Kuo, T.; "Efficient Management for Large-Scale Flash-Memory Storage Systems with Resource Conservation"; ACM Transaction on Storage, vol. 1, No. 4; Nov. 2005, pp. 381-418.

* cited by examiner

FATIGUE MANAGEMENT SYSTEM AND METHOD FOR HYBRID NONVOLATILE SOLID STATE MEMORY SYSTEM

CROSS-REFERENCE TO RELATED APPLICATIONS

This application is a continuation-in-part of U.S. application Ser. No. 11/952,648 filed on Dec. 7, 2007, which claims the benefit of U.S. Provisional Application No. 60/869,493 filed on Dec. 11, 2006. This application also claims the benefit of U.S. Provisional Application No. 61/032,774 filed on Feb. 29, 2008. The disclosures of the above applications are incorporated herein by reference in their entirety.

FIELD

The present disclosure relates to solid state memories, and more particularly to hybrid nonvolatile solid state memories.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Flash memory chips, which use charge storage devices, have become a dominant chip type for semiconductor-based mass storage devices. The charge storage devices are particularly suitable in applications where data files to be stored include music and image files. Charge storage devices, however, can sustain a limited number of write cycles after which the charge storage devices can no longer reliably store data.

A limited number of write cycles may be acceptable for many applications such as removable USB (universal serial bus) drives, MP3 (MPEG Layer 3) players, and digital camera memory cards. However, when used as general replacements for bulk nonvolatile storage in computer systems, a limited number of write cycles may not be acceptable.

Lower density flash devices, where a single bit is stored per storage cell, typically have a usable lifetime on the order of 100,000 write cycles. To reduce cost, flash devices may store 2 bits per storage cell. Storing 2 bits per storage cell, however, may reduce the usable lifetime of the device to a level on the order of 10,000 write cycles.

Flash devices may not have a long enough lifetime to serve as mass storage, especially where part of the mass storage is used as virtual memory paging space. Virtual memory paging space is typically used by operating systems to store data from RAM (random access memory) when available space in RAM is low. For purposes of illustration only, a flash memory chip may have a capacity of 2 GB (gigabytes), may store 2 bits per cell, and may have a write throughput of about 4 MB/s (megabytes per second). In such a flash memory chip, it is theoretically possible to write every bit in the chip once every 500 seconds (i.e., $2\text{E}9$ bytes/$4\text{E}6$ bytes/s).

It is then theoretically possible to write every bit 10,000 times in only $5\text{E}6$ seconds ($1\text{E}4$ cycles*$5\text{E}2$ seconds), which is less than two months. In reality, however, most drive storage will not be written with 100% duty cycle. A more realistic write duty cycle may be 10%, which may happen when a computer is continuously active and performs virtual memory paging operations. At 10% write duty cycle, the usable lifetime of the flash device may be exhausted in approximately 20 months. By contrast, the life expectation for a magnetic hard disk storage device typically exceeds 10 years.

FIG. 1 illustrates a functional block diagram of a conventional solid-state disk 100. The solid-state disk 100 includes a controller 102 and a flash memory 104. The controller 102 receives instructions and data from a host (not shown). When a memory access is requested, the controller 102 reads or writes data to the flash memory 104, and communicates this information to the host.

An area (or memory block) of the flash memory 104 may become unreliable for storage after the area has been written to or erased a predetermined number of times. This predetermined number of times is referred to as the write cycle lifetime of the flash memory 104. Once the write cycle lifetime of the flash memory 104 has been exceeded, the controller 102 can no longer reliably store data in the flash memory 104, and the solid-state disk 100 may no longer be usable.

SUMMARY

In various embodiments, the present disclosure is directed to a solid state memory system. The system comprises a first nonvolatile semiconductor memory having a first write cycle lifetime and a first set of physical addresses, and a second nonvolatile semiconductor memory having a second write cycle lifetime and a second set of physical addresses. The first write cycle lifetime is greater than the second write cycle lifetime. The system further comprises a fatigue management module to generate a write frequency ranking for a plurality of logical addresses. The fatigue management module maps each of the plurality of logical addresses to a physical address of the first set of physical addresses or the second set of physical addresses based on the write frequency rankings.

In various embodiments, the present disclosure is directed to a fatigue management method for a solid state memory system. The method comprises providing a first nonvolatile semiconductor memory having a first write cycle lifetime and a first set of physical addresses, and providing a second nonvolatile semiconductor memory having a second write cycle lifetime and a second set of physical addresses. The first write cycle lifetime is greater than the second write cycle lifetime. The method further comprises generating a write frequency ranking for a plurality of logical addresses, and mapping each of the plurality of logical addresses to a physical address of the first set of physical addresses or the second set of physical addresses based on the write frequency rankings.

In still other features, the systems and methods described above are implemented by a computer program executed by one or more processors. The computer program can reside on a computer readable medium such as but not limited to memory, nonvolatile data storage and/or other suitable tangible storage mediums.

In still other features, the systems and methods described above are implemented by a computer program executed by one or more processors. The computer program can reside on a computer readable medium such as but not limited to memory, nonvolatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
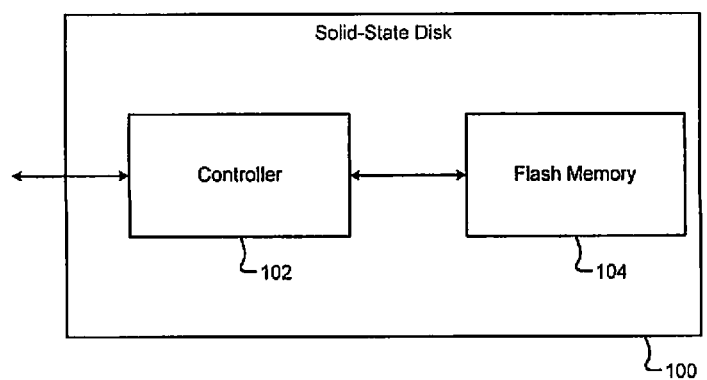
FIG. 1 is a functional block diagram of a solid state disk drive according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure. As used herein, the term "based on" or "substantially based on" refers to a value that is a function of, proportional to, varies with, and/or has a relationship to another value. The value may be a function of, proportional to, vary with, and/or have a relationship to one or more other values as well.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

The cost of charge-storage-based flash devices such as Nitride Read-Only Memory (NROM) and NAND flash has been decreasing in recent years. At the same time, new high-density memory technologies are being developed. Some of these memory technologies, such as phase change memory (PCM), may provide significantly higher write endurance capability than charge-storage-based flash devices. However, being newer technologies, the storage capacity, access time, and/or cost of these memories may be less attractive than the storage capacity, access time, and/or cost of the flash devices.

To combine the longer write cycle lifetime of new memory technologies with the low cost of traditional technologies, a solid-state memory system can be constructed using both types of memory. Large amounts of low cost memory may be combined with smaller amounts of memory having a higher write cycle lifetime. The memory having the higher write cycle lifetime can be used for storing frequently changing data, such as operating system paging data.

Figure 2:
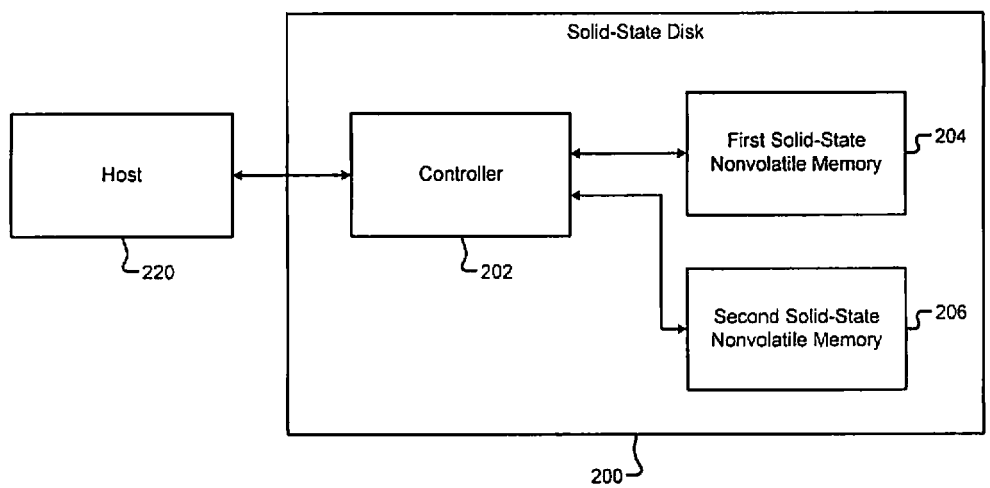
FIG. 2 is a functional block diagram of a solid state disk drive according to the present disclosure.

FIG. 2 depicts an exemplary solid-state memory system. The solid-state memory system may be used as a solid-state disk in a computer system or other device that may need to store data, e.g., a cell phone, set top box, automobile component, wireless personal digital assistant (PDA), and the like. For example only, a PCM chip, such as a 2 GB PCM chip, may be combined with NAND flash devices or NROM flash devices. The write cycle lifetime of PCM memory may soon be of the order of 1E13 write cycles. PCM chips having a write cycle lifetime in excess of 1E7 write cycles are available. At 1E7 write cycles, a PCM chip has a write cycle lifetime that is 1000 times longer than a 2 bit/cell flash device that can endure 1E4 write cycles.

PCM chips may provide faster data throughput than the flash device. For example, a PCM chip may provide 100 times faster data throughput than the flash device. Even if the PCM chip provides 100 times faster data throughput than the flash device, the 1000 time greater write cycle lifetime yields an effective write cycle lifetime that is 10 times longer than the flash device. For example, at 10% write duty cycle, it would take 15.9 years to exhaust the lifetime of the PCM chip even if the PCM chip provides 100 times faster data throughput than the flash device.

FIG. 2 illustrates a functional block diagram of an exemplary solid-state disk 200 according to one implementation of the present disclosure. The solid-state disk 200 includes a controller 202 and first and second solid-state nonvolatile memories 204, 206. Throughout the remainder of this disclosure, solid-state nonvolatile memories may be implemented as integrated circuits (IC). The controller 202 receives access requests from a host 220. The controller 202 directs the access requests to the first solid-state nonvolatile memory 204 or the second solid-state nonvolatile memory 206, as described in greater detail below.

For example only, the first solid-state nonvolatile memory 204 may include relatively inexpensive nonvolatile memory arrays and have a large capacity. The second solid-state nonvolatile memory 206 may have a greater write cycle lifetime while being more expensive and having a smaller capacity than the first solid-state nonvolatile memory 204. In various implementations, the host 220 may specify to the controller 202 the logical addresses that correspond to data that will change relatively frequently and the logical addresses that correspond to data that will change relatively infrequently.

The controller 202 may map the logical addresses corresponding to data that will change relatively frequently to physical addresses in the second solid-state nonvolatile memory 206. The controller 202 may map the logical addresses corresponding to data that will change relatively infrequently to physical addresses in the first solid-state nonvolatile memory 204.

The first solid-state nonvolatile memory 204 may include single-level cell (SLC) flash memory or multi-level cell (MLC) flash memory. The second solid-state nonvolatile memory 206 may include single-level cell (SLC) flash memory or multi-level cell (MLC) flash memory.

Figure 3:
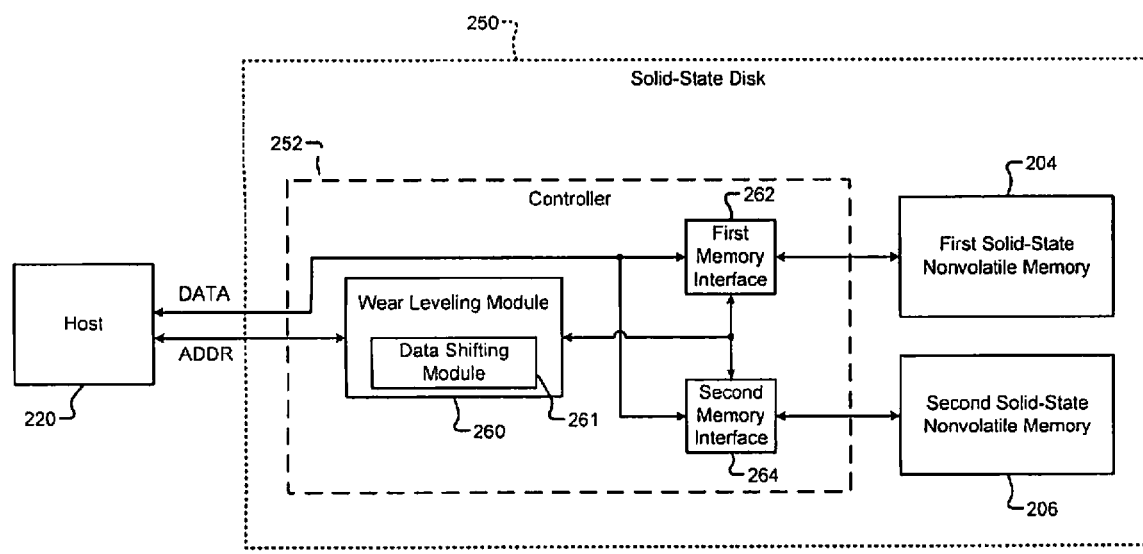
FIG. 3 is a functional block diagram of a solid state disk drive including a wear leveling module.

Before a detailed discussion, a brief description of drawings is presented. FIG. 3 depicts an exemplary solid-state disk 250 including a wear leveling module 260. In one implementation, the wear leveling module 260 controls mapping between logical addresses from the host 220 to physical addresses in the first and second solid-state memories 204, 206. The wear leveling module 260 may perform this mapping based on information from the host.

Alternatively or additionally, the wear leveling module 260 may measure or estimate the wear across all areas of both the solid-state nonvolatile memories 204, 206 and change the mapping to equalize wear across all areas of both the solid-state nonvolatile memories 204, 206. In one implementation, the goal of the wear leveling module 260 is to level the wear across all the areas of the solid-state nonvolatile memories 204, 206 so that no one area wears out before other areas of the solid-state nonvolatile memories 204, 206.

With various nonvolatile memories, writing data to a memory block may require erasing or writing to the entire memory block. In such a block-centric memory, the wear leveling module 260 may track the number of times that each memory block has been erased or written. When a write request arrives from the host, the wear leveling module 260 may select a memory block of memory that has been written to the least from among the available memory blocks. The wear leveling module 260 then maps the incoming logical address to the physical address of this memory block. Over time, this may produce a nearly uniform distribution of write operations across memory blocks.

Figure 4A:
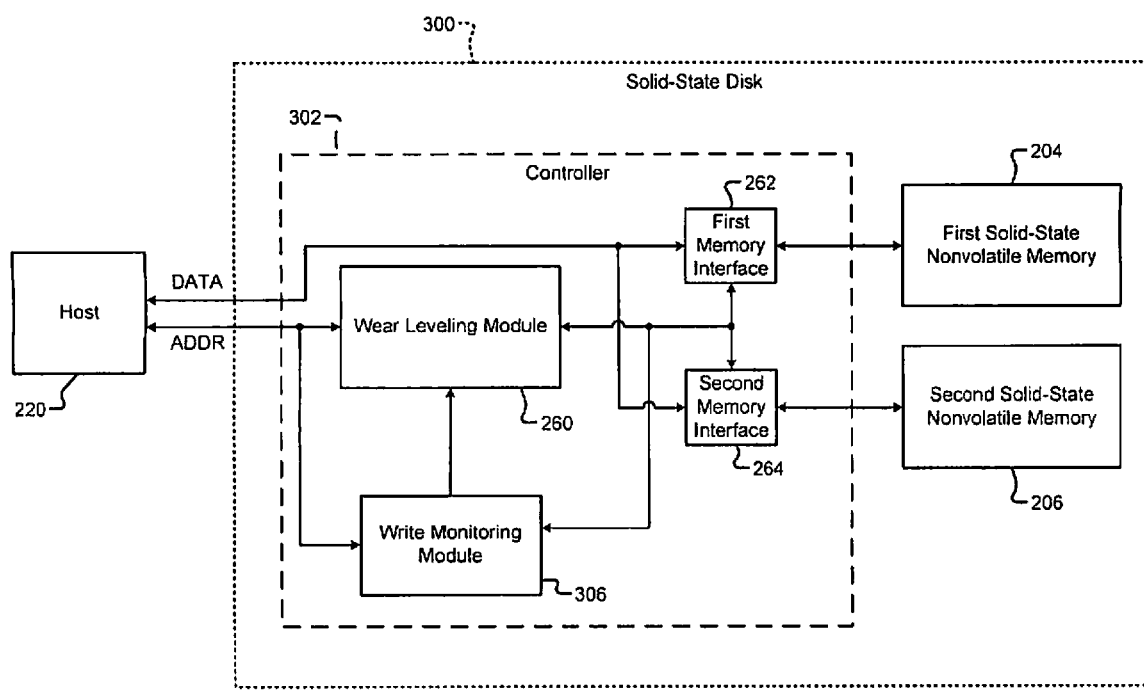
FIG. 4A is a functional block diagram of a solid state disk drive including the wear leveling module of FIG. 3 and a write monitoring module.
Figure 4B:
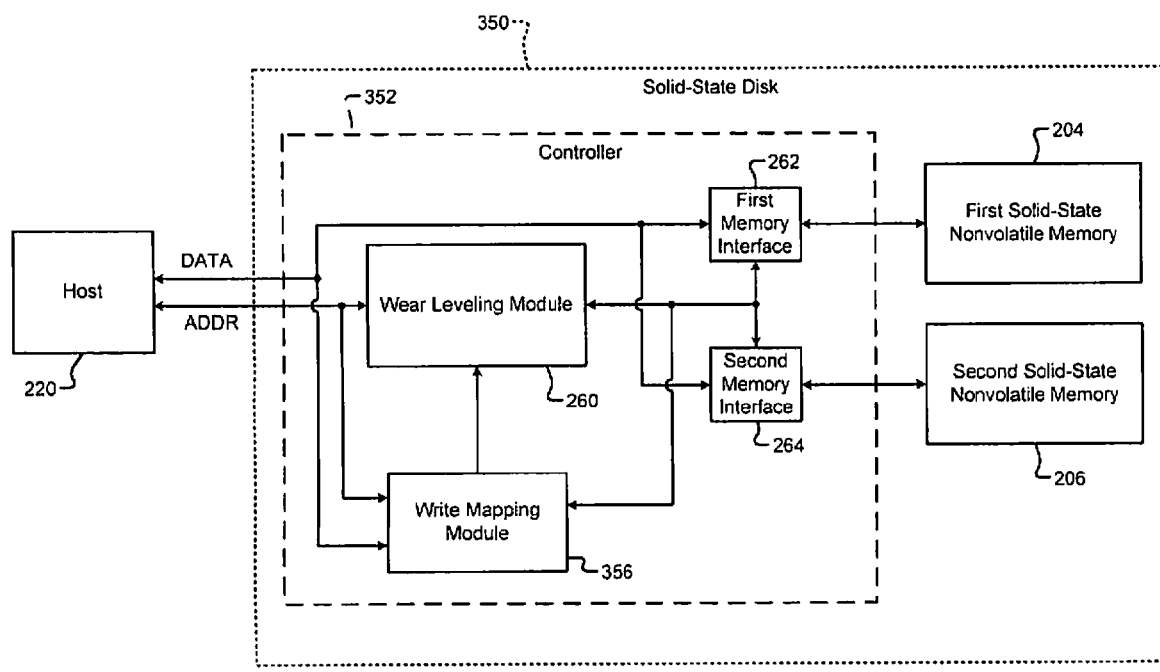
FIG. 4B is a functional block diagram of a solid state disk drive including the wear leveling module FIG. 3 and a write mapping module.

FIGS. 4A and 4B include additional modules that help to control wear leveling. In FIG. 4A, the wear leveling module 260 determines how frequently data is written to each of the logical addresses. In one implementation, logical addresses that are the target of relatively frequent writes or erases are mapped to physical addresses that have not experienced as much wear.

Figure 5:
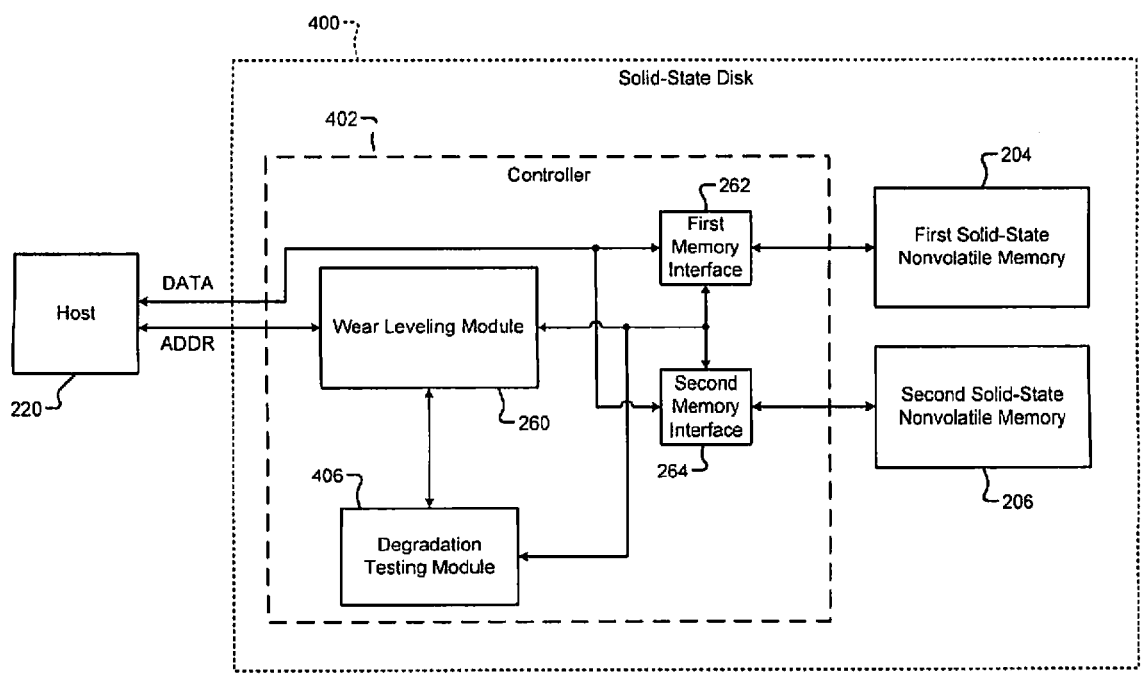
FIG. 5 is a functional block diagram of a solid state disk drive including a degradation testing module and the wear leveling module of FIG. 3.

In FIG. 4B, a write mapping module 356 receives write frequency information from the host 220. The write frequency information identifies the logical addresses that correspond to data that is expected to change relatively frequently and/or the logical addresses that correspond to data that is expected to change relatively infrequently. In addition, the write mapping module 356 may determine how frequently data is actually written to the logical addresses, as in FIG. 4A. FIG. 5 shows a solid-state disk 400 where degradation of the memory and resulting remaining life is determined empirically, in addition to or instead of estimating remaining life based on the number of writes or erases.

Figure 6:
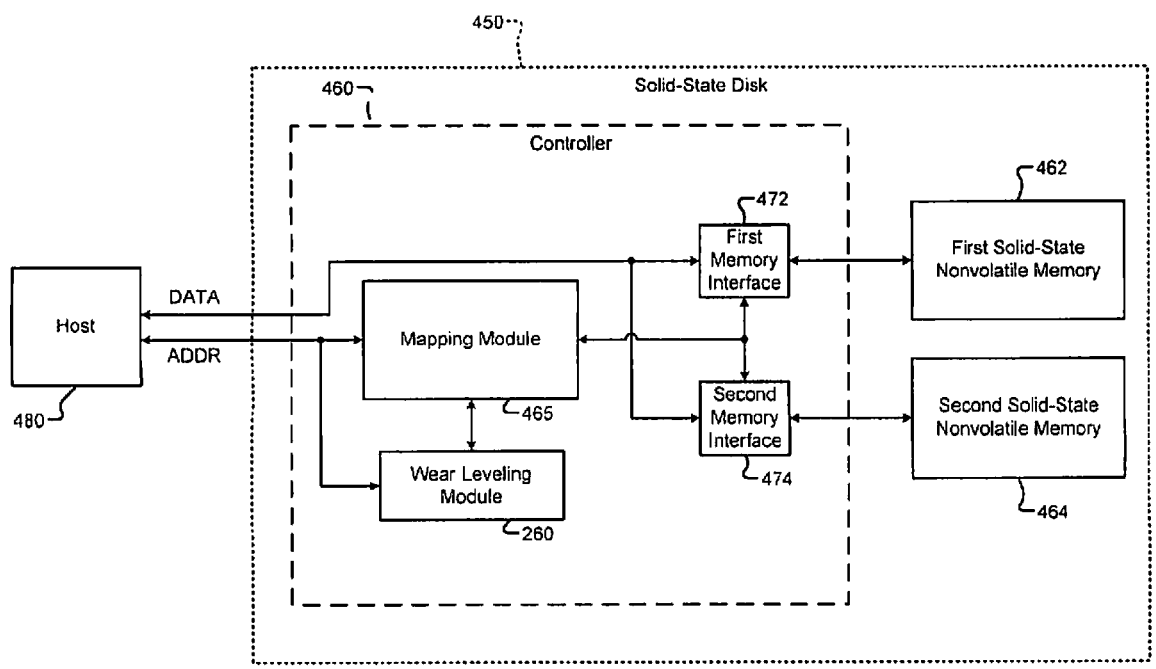
FIG. 6 is a functional block diagram of a solid state disk drive including a mapping module and the wear leveling module of FIG. 3.

FIG. 6 shows a solid-state disk 450 where a combination of first and second solid-state nonvolatile memories 462, 464 is used for caching data. In one implementation, the first solid-state nonvolatile memory 462 has a high storage capacity (for example, 2 GB or greater). In one implementation, the second solid-state nonvolatile memory 464 has a faster access time than the first solid-state nonvolatile memory 462, and has a smaller storage capacity (for example, 2 GB or less) than the first solid-state nonvolatile memory 462. The first and second memories 462, 464 may both have high write cycle lifetimes.

A mapping module 465 may be used to map logical addresses from a host to the first and second solid-state nonvolatile memories 462, 464 based on access time considerations. The mapping module 465 may receive access time information from the host 480, such as a list of addresses for which quick access times are or are not desirable. Alternatively or additionally, the mapping module 465 may monitor accesses to logical addresses, and determine for which logical addresses reduced access times would be most beneficial. The logical addresses for which low access times are important may be mapped to the second solid-state nonvolatile memory 464, which (in one implementation) has reduced access times.

As used herein, access times may include, for example, read times, write times, erase times, and/or combined access times that incorporate one or more of the read, write, or erase times. For example, a combined access time may be an average of the read, write, and erase times. By directing certain logical addresses to be mapped to the second solid-state nonvolatile memory 464, the host 480 may optimize storage for operations such as fast boot time or application startup. The mapping module 465 may also be in communication with a wear leveling module 260 that adapts the mapping to prevent any one area in the first and second solid-state nonvolatile memories 462, 464 from wearing out prematurely.

FIGS. 7A-7E depict exemplary steps performed by the controllers shown in FIGS. 4A-5. FIG. 8 depicts exemplary steps performed by the controller shown in FIG. 6. A detailed discussion of the systems and methods shown in FIGS. 2-8 is now presented.

Referring now to FIG. 3, a solid-state disk 250 includes a controller 252 and the first and second solid-state nonvolatile memories 204 and 206. The controller 252 communicates with the host 220. The controller 252 comprises a wear leveling module 260 and first and second memory interfaces 262, 264. The wear leveling module 260 communicates with the first and second solid-state nonvolatile memory 204 via first and second memory interfaces 262, 264, respectively.

The wear leveling module 260 receives logical addresses from the host 220. The logical addresses are converted into physical addresses associated with the first memory interface 262 and/or the second memory interface 264. During a write operation, data from the host 220 is written to the first solid-state nonvolatile memory 204 via the first memory interface 262 or to the second solid-state nonvolatile memory 206 via the second memory interface 264. During a read operation, data is provided to the host 220 from the first or second solid-state nonvolatile memory 204, 206 via the first or second memory interface 262, 264, respectively.

For example only, the first solid-state nonvolatile memory 204 may be relatively inexpensive per megabyte of capacity and may therefore have a large capacity. The second solid-state nonvolatile memory 206 may have a longer write cycle lifetime and may be more expensive than the first solid-state nonvolatile memory 204, and may therefore have a smaller capacity.

The first and second solid-state nonvolatile memories 204 and 206 may be written to and/or erased in blocks. For example, in order to erase one byte in a memory block, all bytes of the memory block may need to be erased. In addition, in order to write one byte of a memory block, all bytes of the memory block may need to be written. The wear leveling module 260 may track and store the number of write and/or erase operations performed on the memory blocks of the first and second solid-state nonvolatile memories 204, 206.

The wear leveling module 260 may use a normalized version of the write and/or erase cycle counts. For example, the number of write cycles performed on a memory block in the first solid-state nonvolatile memory 204 may be divided by the total number of write cycles that a memory block in the first solid-state nonvolatile memory 204 can endure. A normalized write cycle count for a memory block in the second solid-state nonvolatile memory 206 may be obtained by dividing the number of write cycles already performed on that memory block by the number of write cycles that the memory block can endure.

The wear leveling module 260 may write new data to the memory block that has the lowest normalized write cycle count. To avoid fractional write cycle counts, the write cycle counts can be normalized by multiplying the write cycle counts by constants based on the write cycle lifetime of the respective memories 204 and 206. For example, the number of write cycles performed on a memory block of the first solid-state nonvolatile memory 204 may be multiplied by a ratio. The ratio may be the write cycle lifetime of the second solid-state nonvolatile memory 206 divided by the write cycle lifetime of the first solid-state nonvolatile memory 204.

In various implementations, the write cycle count may only be partially normalized. For example, the write cycle lifetime of the second solid-state nonvolatile memory 206 may be significantly higher than the write cycle lifetime of the first solid-state nonvolatile memory 204. In such a case, the write cycle count of the first solid-state nonvolatile memory 204 may be normalized using a write cycle lifetime that is less than the actual write cycle lifetime. This may prevent the wear leveling module 260 from being too heavily biased toward assigning addresses to the second solid-state nonvolatile memory 206.

The normalization may be performed using a predetermined factor. For example, if the write cycle lifetime of the first solid-state nonvolatile memory 204 is 1E6, and for a given application of the solid-state disk 250, the necessary write cycle lifetime of the second solid-state nonvolatile memory 206 is 1E9, the normalization can be performed using a factor of 1,000. The factor may be a rounded off estimate and not an exact calculation. For example, a factor of 1000 may be used when respective write cycle lifetimes are 4.5 E6 and 6.3 E9.

The wear leveling module 260 may include a data shifting module 261. In one implementation, the data shifting module 261 identifies a first memory block having stored data that remains unchanged over a predetermined period of time. Such stored data may be called static data. The static data may be moved to a second memory block of memory that has experienced more frequent write cycles than the first memory block. The wear leveling module 260 may map the logical addresses that were originally mapped to the physical addresses of the first memory block, to the physical addresses of the second memory block. Since the static data is now stored in the second memory block, the second memory block may experience fewer write cycles.

Additionally, static data may be shifted from the second solid-state nonvolatile memory 206 to the first solid-state nonvolatile memory 204. For example, the data shifting module 261 may identify a least used memory block (LUB) of the second solid-state nonvolatile memory 206. If a number of write operations performed on a memory block during a predetermined period is less than or equal to a predetermined threshold, the memory block is called a LUB. When the amount of usable or available memory in the second solid-state nonvolatile memory 206 decreases to a predetermined threshold, the wear leveling module 260 may map the LUB to a memory block of the first solid-state nonvolatile memory 204.

Occasionally, the number of write operations performed on a first memory block of the first solid-state nonvolatile memory 204 may exceed a predetermined threshold. The wear leveling module 260 may bias mapping of logical addresses that were originally mapped to the first memory block, to a second memory block of the second solid-state nonvolatile memory 206 thereby reducing the wear on the first solid-state nonvolatile memory 204.

Referring now to FIG. 4A, a solid-state disk 300 includes a controller 302 that interfaces with the host 220. The controller 302 includes the wear leveling module 260, a write monitoring module 306, and the first and second memory interfaces 262 and 264. The write monitoring module 306 monitors logical addresses received from the host 220. The write monitoring module 306 may also receive control signals indicating whether a read or a write operation is occurring. Additionally, the write monitoring module 306 tracks the logical addresses to which data is frequently written by measuring frequencies at which data is written to the logical addresses. This information is provided to the wear leveling module 260, which biases the logical addresses to, e.g., physical addresses of the second solid-state nonvolatile memory 206.

Referring now to FIG. 4B, a solid-state disk 350 includes a controller 352, which interfaces with the host 220. The controller 352 includes a wear leveling module 260, a write mapping module 356, and first and second memory interfaces 262, 264. The write mapping module 356 receives address information from the host 220 indicating the logical addresses that will be more frequently written to. This information is provided to the wear leveling module 260, which biases the logical addresses to the second solid-state nonvolatile memory 206.

The write mapping module 356 may also include functionality similar to the write monitoring module 306 of FIG. 4A. The write mapping module 356 may therefore update stored write frequency data based on measured write frequency data. Additionally, the write mapping module 356 may determine write frequencies for the logical addresses that were not provided by the host 220. In one implementation, the write frequency data may be adjusted even if a logical address has not been accessed for a predetermined period. The wear leveling module 260 may store all data corresponding to the logical addresses that are flagged as frequently written to in the second solid-state nonvolatile memory 206.

If the second solid-state nonvolatile memory 206 is full, the write operations may be assigned to the first solid-state nonvolatile memory 204 and vice versa. Data can also be remapped and moved from the second solid-state nonvolatile memory 206 to the first solid-state nonvolatile memory 204 to create space in the second solid-state nonvolatile memory 206 and vice versa. Alternatively, data may be mapped solely to the first or the second solid-state nonvolatile memory 204, 206 when the wear level of the second or the first solid-state nonvolatile memory 206, 204 is greater than or equal to a predetermined threshold. It should be noted that the predetermined threshold for the wear level of the first and second solid-state nonvolatile memory 204, 206 may be the same or different. Furthermore, the predetermined threshold may vary at different points in time. For example, once a certain number of write operations have been performed on the first solid-state nonvolatile memory 204, the predetermined threshold may be adjusted to take into consideration the performed write operations.

The wear leveling module 260 may also implement the write monitoring module 306 and the write mapping module 356. Hereinafter, the wear leveling module 260 may also include the write monitoring module 306 and the write mapping module 356.

Referring now to FIG. 5, the solid-state disk 400 includes a controller 402 that interfaces with the host 220. The controller 402 includes the wear leveling module 260, a degradation testing module 406, and the first and second memory interfaces 262, 264. The degradation testing module 406 tests the first and second solid-state nonvolatile memories 204, 206 to determine whether their storage capability has degraded.

In various implementations, the degradation testing module 406 may test only the first solid-state nonvolatile memory 204, since the write cycle lifetime of the first solid-state nonvolatile memory 204 (in one implementation) is less than the write cycle lifetime of the second solid-state nonvolatile memory 206. The degradation testing module 406 may periodically test for degradation. The degradation testing module 406 may wait for periods of inactivity, at which point the degradation testing module 406 may provide addresses and data to the first and/or second memory interfaces 262, 264.

The degradation testing module 406 may write and then read data to selected areas of the first and/or second solid-state nonvolatile memories 204, 206. The degradation testing module 406 can then compare the read data to the written data. In addition, the degradation testing module 406 may read data written in previous iterations of degradation testing.

Alternatively, the degradation testing module 406 may write the same data to the same physical address at first and second times. At each of the two times, the degradation testing module 406 may read back the data written. The degradation testing module 406 may determine a degradation value for the physical address by comparing the data read back at the two times or by comparing the data read back at the second time to the written data.

The wear leveling module 260 may adapt its mapping based on the degradation value measured by the degradation testing module 406. For example, the degradation testing module 406 may estimate a maximum write cycle count for a memory block based on the amount of degradation. The wear leveling module 260 may then use this maximum write cycle count for normalization.

Alternatively, the wear leveling module 260 may use the number of writes cycles remaining for a memory block to make assignment decisions. If one of the solid-state nonvolatile memories 204, 206 is approaching the end of its usable lifetime (e.g., a predetermined threshold), the wear leveling module 260 may assign all new writes to the other one of the solid-state nonvolatile memories 204, 206.

The wear leveling module 260 may also implement the degradation testing module 406. Hereinafter, the wear leveling module 260 includes the degradation testing module 406.

Referring now to FIG. 6, a small solid-state nonvolatile memory having a faster access time may be used in combination with a large solid-state nonvolatile memory having a slower access time. A solid-state disk 450 may include a controller 460, a first solid-state nonvolatile memory 462, and a second solid-state nonvolatile memory 464. The controller 460 interfaces with a host 480. The controller 460 may include first and second memory interfaces 472, 474. The first solid-state nonvolatile memory 462 may be inexpensive and may have a high storage capacity and a high write cycle lifetime but a lower read/write speed (i.e., access time). The second solid-state nonvolatile memory 464 may be smaller in storage capacity, may be more expensive, and may have a high write cycle lifetime and a faster access time relative to the first solid-state nonvolatile memory 462.

The second solid-state nonvolatile memory 464 may have a write access time, a read access time, an erase time, a program time, or a cumulative access time that is shorter than that of the first solid-state nonvolatile memory 462. Accordingly, the second solid-state nonvolatile memory 464 may be used to cache data. The controller 460 may include the wear leveling module 260 and a mapping module 465. The wear leveling module 260 may also implement the mapping module. The mapping module 465 may map the logical addresses to the physical addresses of one of the first and second solid-state nonvolatile memory 462, 464 based on access times and/or storage capacities of the first and second solid-state nonvolatile memory 462, 464.

Specifically, the mapping module may receive data from the host 220 related to the frequencies and access times at which data may be written to the logical addresses. The mapping module 465 may map the logical addresses that are to be written more frequently and/or faster than others to the physical addresses of second solid-state nonvolatile memory 464. All other logical addresses may be mapped to the physical addresses of the first nonvolatile memory 462. The actual write frequencies access times may be updated by measuring write frequencies and/or access times when data is written. In doing so, the mapping module 465 may minimize overall access time for all accesses made to the solid-state disk 450 during read/write/erase operations.

Depending on the application executed by the host 220, the mapping module 465 may consider additional factors when mapping the logical addresses to one of the first and second solid-state nonvolatile memory 462, 464. The factors may include but are not limited to the length of a memory block being written and the access time with which the memory block needs to be written.

Referring now to FIGS. 7A-7E, a method 500 for providing a hybrid nonvolatile solid-state (NVS) memory system using first and second NVS memories having different write cycle lifetimes and storage capacities is shown. The first NVS memory has a lower write cycle lifetime and higher capacity than the second NVS memory.

Figure 7A:
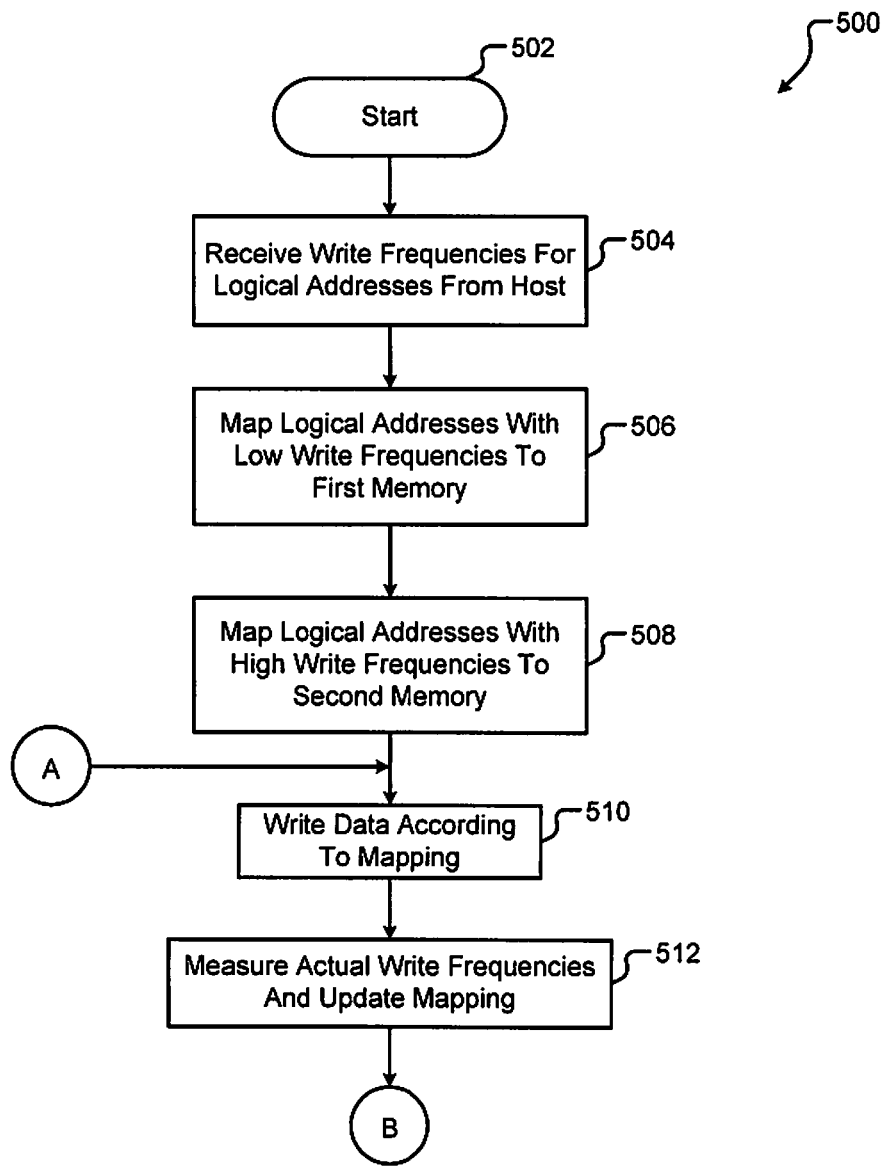
FIGS. 7A-7E are exemplary flowcharts of a method for operating the solid state disk drives illustrated in FIGS. 2-5.
Figure 8:
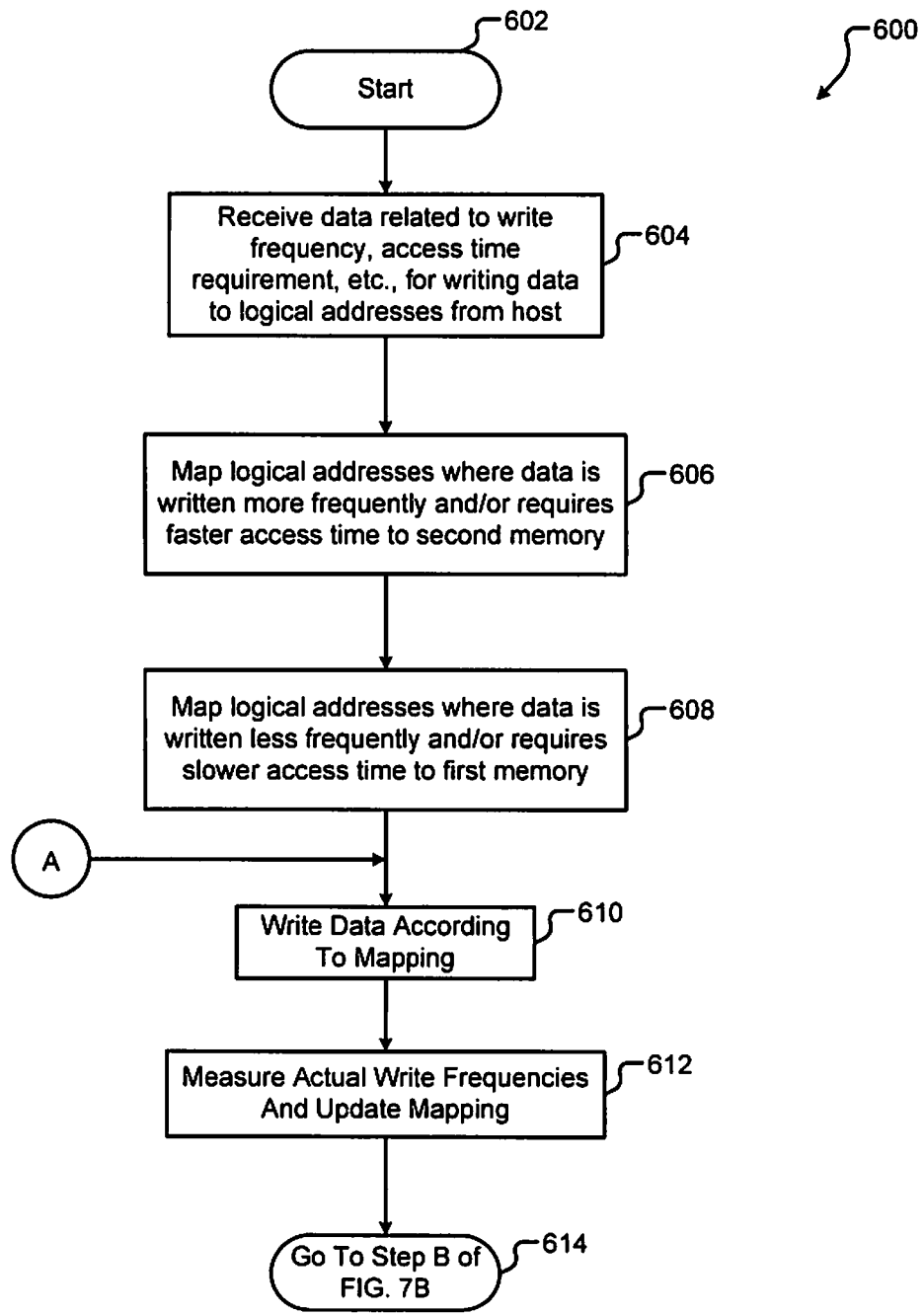
FIG. 8 is an exemplary flowchart of a method for operating the solid state disk drive illustrated in FIG. 6.

In FIG. 7A, the method 500 begins at step 502. Control receives write frequencies for logical addresses where data is to be written from the host in step 504. Control maps the logical addresses having low write frequencies (e.g., having write frequencies less than a predetermined threshold) to the first NVS memory in step 506. Control maps the logical addresses having high write frequencies (e.g., having write frequencies greater than a predetermined threshold) to the second NVS memory in step 508.

Control writes data to the first and/or second NVS memories in step 510 according to the mapping generated in steps 506 and 508. Control measures actual write frequencies at which data is in fact written to the logical addresses and updates the mapping in step 512.

Figure 7B:
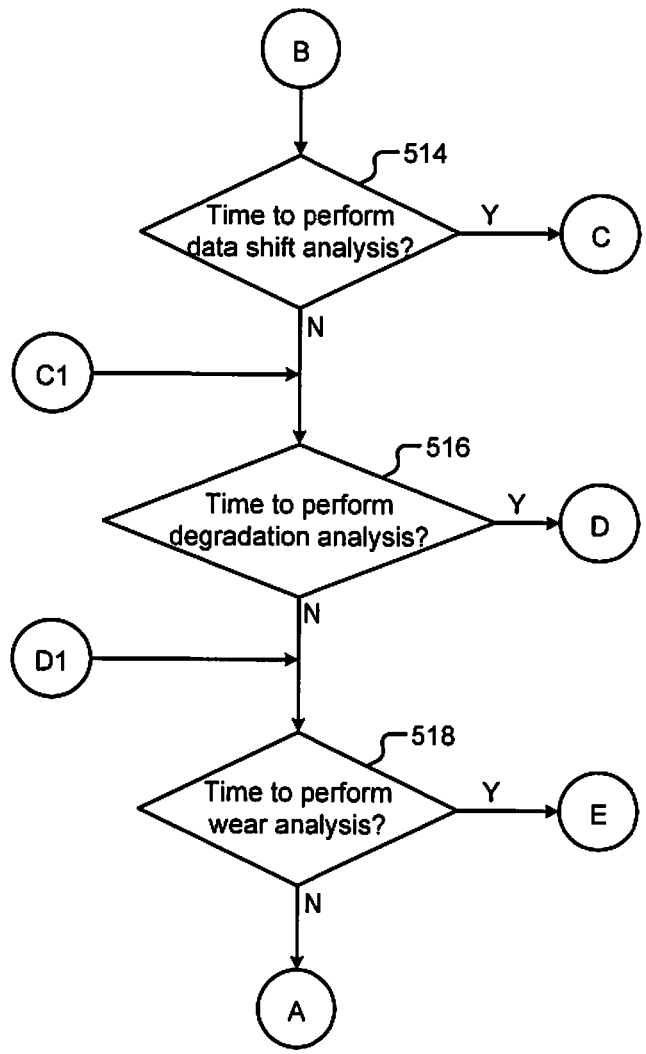

In FIG. 7B, control determines whether time to perform data shift analysis has arrived in step 514. If the result of step 514 is false, control determines whether time to perform degradation analysis has arrived in step 516. If the result of step 516 is false, control determines whether time to perform wear level analysis has arrived in step 518. If the result of step 514 is false, control returns to step 510.

Figure 7C:
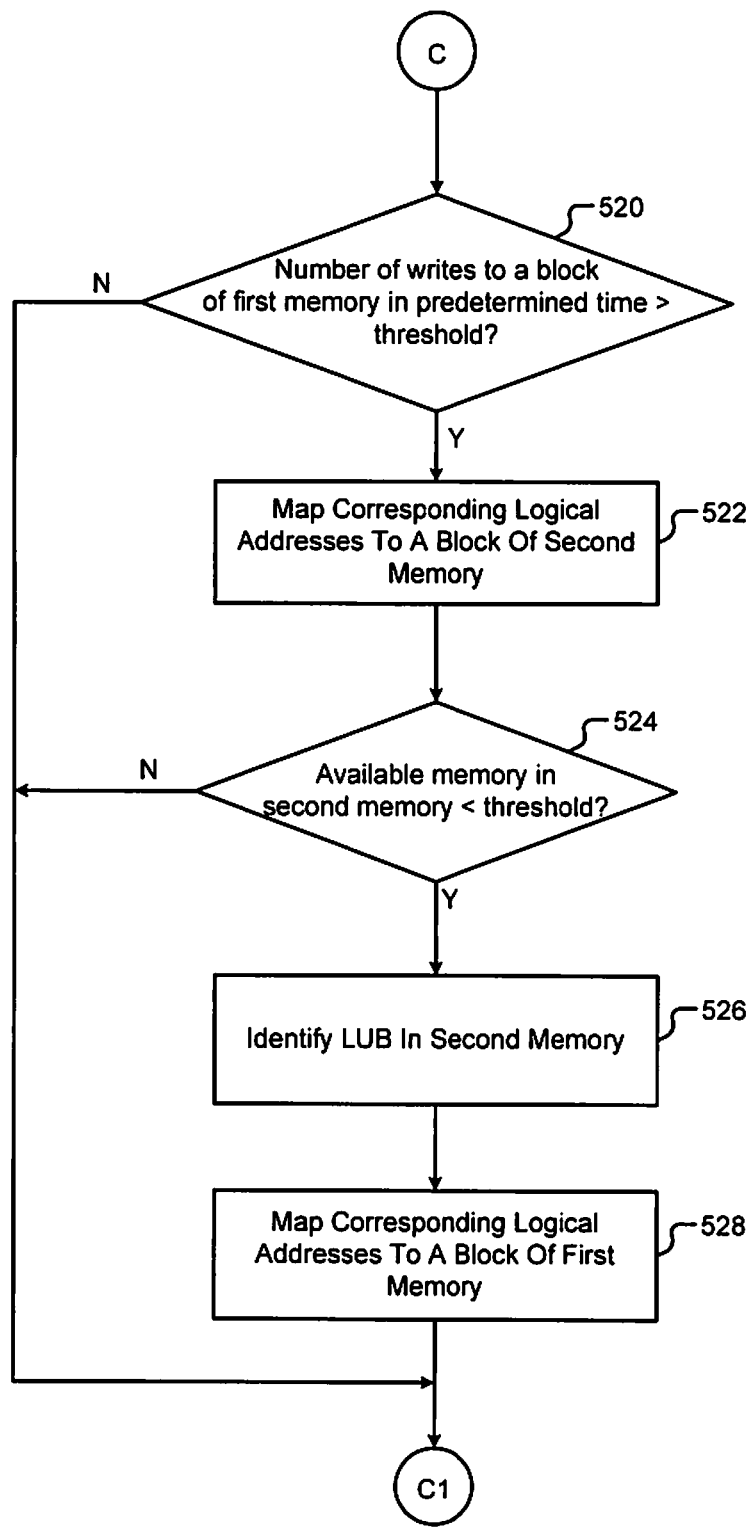

In FIG. 7C, when the result of step 514 is true, control determines in step 520 if a number of write operations to a first memory block of the first NVS memory during a predetermined time is greater than or equal to a predetermined threshold. If the result of step 520 is false, control returns to step 516. If the result of step 520 is true, control maps the logical addresses that correspond to the first memory block to a second memory block of the second NVS memory in step 522.

Control determines in step 524 if the available memory in the second NVS memory is less than a predetermined threshold. If the result of step 524 is false, control returns to step 516. If the result of step 524 is true, control identifies a memory block of the second NVS memory is a LUB in step 526. Control maps the logical addresses that correspond to the LUB to a memory block of the first NVS memory in step 528, and control returns to step 516.

Figure 7D:
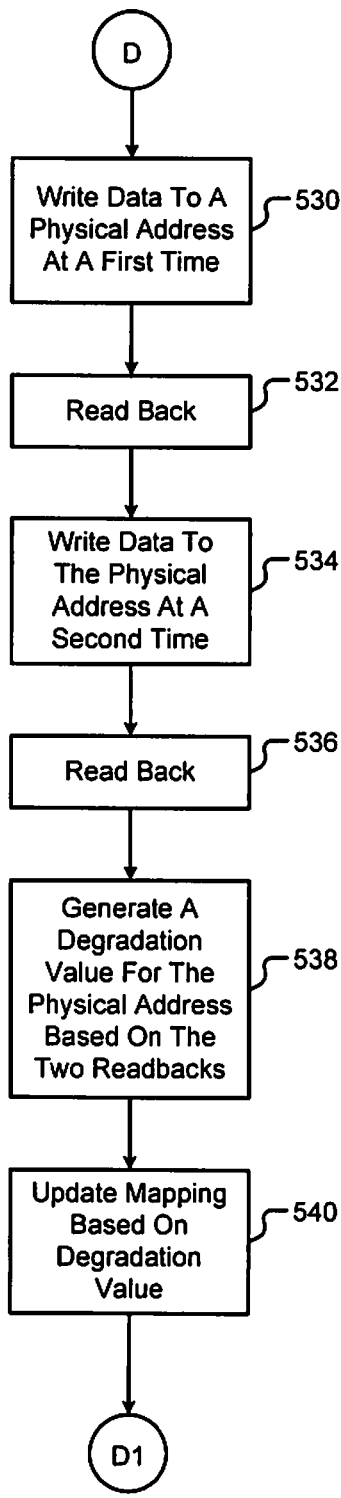

In FIG. 7D, when the result of step 516 is true, control writes data to a physical address at a first time in step 530. Control reads back the data from the physical address in step 532. Control writes data to the physical address at a second time (e.g., after a predetermined time after the first time) in step 534. Control reads back the data from the physical address in step 536. Control compares the data read back in step 532 to the data read back in step 536 and generates a degradation value for the physical address in step 538. Control updates the mapping in step 540, and control returns to step 518.

Figure 7E:
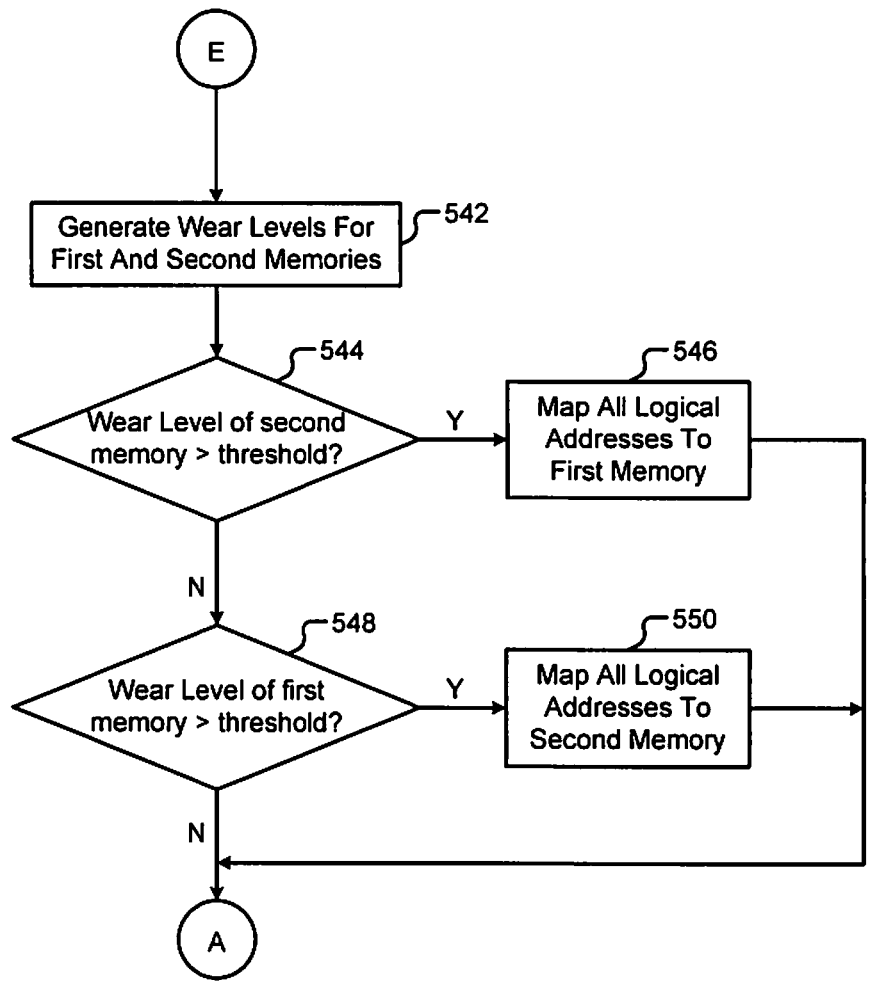

In FIG. 7E, when the result of step 518 is true, control generates wear levels for the first and second NVS memories in step 542 based on the number of write operations performed on the first and second memories and the write cycle lifetime ratings of the first and second memories, respectively. Control determines in step 544 if the wear level of the second NVS memory is greater than a predetermined threshold. If the result of step 544 is true, control maps all the logical memory blocks to physical memory blocks of the first NVS memory in step 546, and control returns to step 510.

If the result of step 544 is false, control determines in step 548 if the wear level of the first NVS memory is greater than a predetermined threshold. If the result of step 548 is true, control maps all the logical memory blocks to physical memory blocks of the second NVS memory in step 550 and, control returns to step 510. If the result of step 548 is false, control returns to step 510.

Referring now to FIG. 8, a method 600 for providing a hybrid nonvolatile solid-state (NVS) memory system for caching data using first and second NVS memories having different access times and storage capacities is shown. The first NVS memory has a higher access time and higher capacity than the second NVS memory. The first and second NVS memories have high write cycle lifetimes.

The method 600 begins at step 602. Control receives data related to write frequency and access time requirement for writing data to logical addresses from the host in step 604. Control maps the logical addresses having high write frequencies (e.g., having write frequencies greater than a predetermined threshold) and/or requiring faster access times to the second NVS memory in step 606. Control maps the logical addresses having low write frequencies (e.g., having write frequencies less than a predetermined threshold) and/or requiring slower access times to the first NVS memory in step 608.

Control writes data to the first and/or second NVS memories in step 610 according to the mapping generated in steps 606 and 608. Control measures actual write frequencies and/or actual access times at which data is in fact written to the logical addresses and updates the mapping in step 612. In step 614, control executes steps beginning at step 514 of the method 500 as shown in FIGS. 7A-7E.

Wear leveling modules according to the principles of the present disclosure may determine wear levels for each memory block of one or more nonvolatile semiconductor memories. The term memory block may refer to the group of memory cells that must be written and/or erased together. For purposes of discussion only, the term memory block will be used for a group of memory cells that is erased together, and the wear level of a memory cell will be based on the number of erase cycles it has sustained.

The memory cells within a memory block will have experienced the same number of erases, although individual memory cells may not have been programmed when the erase was initiated, and thus may not experience as much wear. However, the wear leveling module may assume that the wear levels of the memory cells of a memory block can be estimated by the number of erase cycles the memory block has experienced.

The wear leveling module may track the number of erases experienced by each memory block of the first and second memories. For example, these numbers may be stored in a certain region of the first and/or second memories, in a separate working memory of the wear leveling module, or with their respective memory blocks. For example only, a predetermined area of the memory block, which is not used for user data, may be used to store the total number of times that memory block has been erased. When a memory block is going to be erased, the wear leveling module may read that value, increment the value, and write the incremented value to the memory block after the memory block has been erased.

With a homogeneous memory architecture, the erase count could be used as the wear level of a memory block. However, the first and second memories may have different lifetimes, meaning that the number of erases each memory cell can withstand is different. In various implementations, the second memory has a longer lifetime than the first memory. The number of erases each memory block can withstand is therefore greater in the second memory than in the first.

The number of erases performed on a memory block may therefore not be an appropriate comparison between a memory block from the first memory and a memory block of the second memory. To achieve appropriate comparisons, the erase counts can be normalized. One way of normalizing is to divide the erase count by the total number of erase counts a memory block in that memory is expected to be able to withstand. For example only, the first memory has a write cycle lifetime of 10,000, while the second memory has a write cycle lifetime of 100,000.

A memory block in the first memory that has been erased 1,000 times would then have a normalized wear level of $\frac{1}{10}$, while a memory block in the second memory that has been erased 1,000 times would then have a normalized wear level of $\frac{1}{100}$. Once the wear levels have been normalized, a wear leveling algorithm can be employed across all the memory blocks of both the first and second memories as if all the memory blocks formed a single memory having a singe write cycle lifetime. Wear levels as used herein, unless otherwise noted, are normalized wear levels.

Another way of normalizing, which avoids fractional numbers, is to multiply the erase counts of memory blocks in the first memory (having the lower write cycle lifetime) by the ratio of write cycle lifetimes. In the current example, the ratio is 10 (100,000/10,000). A memory block in the first memory that has been erased 1,000 times would then have a normalized wear level of 10,000, while a memory block in the second memory that has been erased 1,000 times would then have a normalized wear level of 1,000.

When a write request for a logical address arrives at the wear leveling module, the wear leveling module may determine if the logical address is already mapped to a physical address. If so, the wear leveling module may direct the write to that physical address. If the write would require an erase of the memory block, the wear leveling module may determine if there are any unused memory blocks with lower wear levels. If so, the wear leveling module may direct the write to the unused memory block having the lowest wear level.

For a write request to a logical address that is not already mapped, the wear leveling module may map the logical address to the unused memory block having the lowest wear level. If the wear leveling module expects that the logical address will be rewritten relatively infrequently, the wear leveling module may map the logical address to the unused memory block having the highest wear level.

When the wear leveling module has good data for estimating access frequencies, the wear leveling module may move data from a used memory block to free that memory block for an incoming write. In this way, an incoming write to a memory block that is relatively frequently accessed can be written to a memory block with a low wear level. Also, an incoming write to a memory block that is relatively infrequently accessed can be written to a memory block with a high wear level. The data that was moved can be placed in an unused memory block that may be chosen based on how often the moved data is expected to be rewritten.

At various times, such as periodically, the wear leveling module may analyze the wear levels of the memory blocks, and remap relatively frequently rewritten logical addresses to memory blocks with low wear levels. In addition, the wear leveling module may remap relatively infrequently rewritten logical addresses to memory blocks with high wear levels, which is known as static data shifting. Remapping may involve swapping data in two memory blocks. During the swap, the data from one of the memory blocks may be stored in an unused memory block, or in temporary storage.

The wear leveling module may also maintain a list of memory blocks that have surpassed their write cycle lifetime. No new data will be written to these memory blocks, and data that was previously stored in those memory blocks is written to other memory blocks. Although the goal of the wear leveling module is that no memory block wears out before the others, some memory blocks may wear out prematurely under real-world circumstances. Identifying and removing unreliable memory blocks allows the full lifetime of the remaining memory blocks to be used before the solid-state disk is no longer usable.

It should be understood that while the present disclosure, for illustration purposes, describes first and second solid-state nonvolatile memories 204, 206, the teachings of the present disclosure may also be applied to other types of memories. In addition, the memories may not be limited to individual modules. For example, the teachings of the present disclosure may be applied to memory zones within a single memory chip or across multiple memory chips. Each memory zone may be used to store data in accordance with the teachings of the present disclosure.

Figure 9:
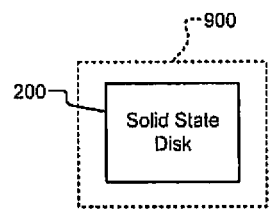
FIG. 9 is a functional block diagram of a system including a solid state disk drive.

FIG. 9 illustrates a system 900. The system 900 can be any device that stores data, e.g., a computer, set top box, cellular phone (or other type of wireless handheld device), and the like. The system 900 includes solid state disk 200 for storing data as described above.

Figure 10:
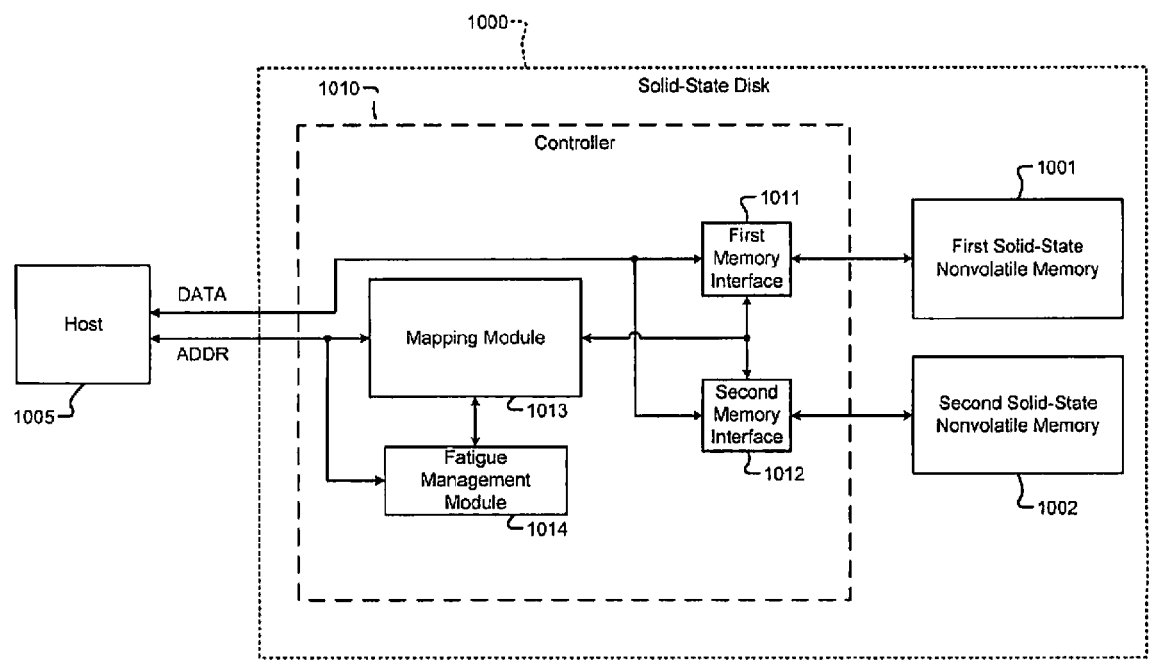
FIG. 10 is a functional block diagram of a solid state disk drive comprising a fatigue management module according to the present disclosure.

FIG. 10 illustrates an exemplary solid-state memory system according to the present disclosure. The memory system includes a solid-state disk 1000 in communication with a host 1005. The solid-state disk may comprise a controller 1010, a first solid-state nonvolatile memory 1001 and a second solid-state nonvolatile memory 1002. As an example only, the first solid-state nonvolatile memory 1001 may comprise a high endurance (i.e., high write cycle lifetime) memory device, such as a single-level cell (SLC) flash chip. The first solid-state nonvolatile memory 1001 may be more expensive and have a lower capacity (and/or density) as compared to second solid-state nonvolatile memory 1002, which may comprise a lower endurance and/or higher capacity (and/or density) memory device, such as a multi-level cell (MLC) flash chip. In this manner, solid-state disk 1000 may provide a storage system that balances endurance levels, capacity, and cost.

Controller 1010 may comprise a first memory interface 1011 and a second memory interface 1012 for interfacing with the first and second solid-state nonvolatile memories, respectively. Further, the controller 1010 may include a mapping module 1013 and a fatigue management module 1014 for mapping the logical addresses received from host 1005 to the physical addresses present in the first and second solid-state nonvolatile memories 1001, 1002. During a write operation, data from the host 1005 is written to the first solid-state nonvolatile memory 1001 via the first memory interface 1011 or to the second solid-state nonvolatile memory 1002 via the second memory interface 1012. During a read operation, data is provided to the host 1005 from the first or second solid-state nonvolatile memory 1001, 1002 via the first or second memory interface 1011, 1012, respectively.

The mapping module 1013 and fatigue management module 1014 may determine to which of the first or second solid-state nonvolatile memories 1001, 1002 a particular logical address will be mapped. Fatigue management module 1014 may also incorporate the mapping module, such that it performs the functions of both the mapping module 1013 and fatigue management module 1014.

In general, the fatigue management module 1014 monitors the number and/or frequency of write operations to the logical addresses received from the host 1005. The logical addresses may identify one or more corresponding memory blocks. Fatigue management module 1014 will map the most frequently written to logical addresses to physical addresses that reside in the memory with the higher endurance. In furtherance of this goal, fatigue management module 1014 may generate a write frequency ranking for each of the logical addresses received from host 1005. The write frequency rankings may comprise the full set of logical addresses in the order of the number of writes to each logical address. Alternatively, the write frequency ranking may comprise the number of write operations to each logical address over a predetermined period. The use of a predetermined period allows for logical addresses that have a high number of total write operations, but which are no longer being written to frequently, to change from being designated as a high frequency address to a low frequency address.

In order to generate the write frequency ranking, the fatigue management module 1014 may keep a write count for each logical address to which the host 1005 requests a write operation. When the solid-state disk 1000 is first used, for example, when an operating system is first installed, or after re-formatting in which there is a re-definition of swap space, the fatigue management module 1014 and mapping module 1013 may first write to the higher endurance nonvolatile memory, which in the illustrated example is first solid-state nonvolatile memory 1001. After a predetermined percentage or all of the useable physical addresses of the first solid-state nonvolatile memory 1001 are populated, the next written logical address may be mapped to the lower endurance nonvolatile memory. Once the higher endurance memory is populated to a certain threshold, and the lower endurance memory begins being written to, fatigue management module 1014 will operate to manage the mapping to the two memories. In other words, the most frequently written to logical addresses will be mapped to physical addresses in the higher endurance memory, while the least frequently written to logical addresses will be mapped to the lower endurance memory.

In one example, the fatigue management module 1014 ranks logical addresses according to the total number of write operations that have been performed to them. The highest ranked logical addresses will be mapped to physical addresses in the higher endurance memory, with the remaining logical addresses being addressed to the physical addresses in the lower endurance memory. Alternatively, the ranking of logical addresses may instead be based upon the number of write operations over a predetermined period. In this example, heavily written to logical addresses that have not been written to for a period of time may rank below logical addresses that have recently been written to more frequently. Thus, logical addresses that are mapped to the higher endurance memory may have a lower total number of write operations associated with them than logical addresses in the lower endurance memory. In yet another example, a combination of the total write operations and a write per period ranking may be utilized.

In another exemplary embodiment, the write frequency for a logical address may be determined by the period of time that has elapsed since the logical address was last written to. In this manner, the write frequency rankings can be determined by putting the most recently written to logical address at the top of the rankings, while the logical address with the longest period of time since being written to will be at the bottom. It is contemplated that the elapsed time may be stored such a complete re-ranking of logical addresses does not occur each time the solid-state disk 1000 is powered on. In yet another embodiment, an average of the elapsed time between write cycles for a particular logical address may be used to generate the write frequency ranking for each logical address. Thus, a previously frequently written to logical address that has since become infrequently written to will eventually migrate to a lower write frequency ranking and, thus, be stored in the lower endurance memory. In a further embodiment, the average of the elapsed time between write cycles may be normalized based on the write cycle lifetimes (or, remaining write cycle lifetimes) of the lower and higher endurance memories, as is discussed more fully above.

In order to determine a write frequency and, thus, the write frequency ranking for a logical address, a weighted time-decay average of the write count for each logical address can be calculated according to the following equation:

$$WCA(n+1)=WCA(n)*(1-a)+WE(n)*a, \quad (1)$$

where WCA(n) is the time averaged write count at timestep n; WE(n) is the actual write event at timestep n, which equals 1 if there was write performed at timestep n or otherwise equals 0; and 'a' is a constant chosen to have the appropriate time-decay, where 'a' is sometimes referred to as the "attack rate constant" and (1−a) is sometimes referred to as the "decay rate constant." Alternatively, a two parameter system could be used, such that Equation 1 above becomes:

$$WCA(n+1)=WCA(n)*d+WE(n)*a, \quad (2)$$

where d is the decay rate constant, and all other variables are the same as above.

The actual mapping of logical addresses to physical addresses within either the first or second memories may include the wear leveling functionality described above. Thus, the assignment of a particular logical address to either the first or second memory may be determined by the fatigue management module 1014, while the particular physical address within the selected memory may be determined by the wear leveling module, as described above.

Figure 11:
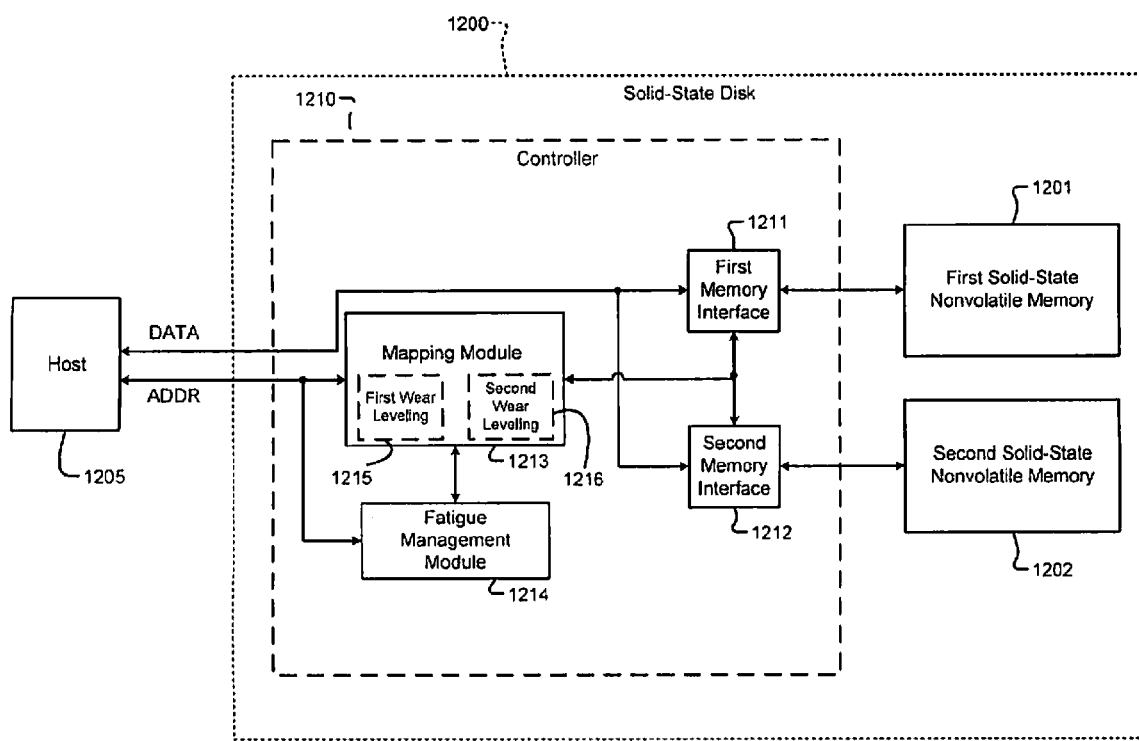
FIG. 11 is a functional block diagram of a solid state disk drive comprising a fatigue management module with independent wear leveling modules for each of the memories according to the present disclosure.

Referring now to FIG. 11, an exemplary solid-state memory system including independent wear leveling modules for each of the memories according to the present disclosure is illustrated. The memory system includes a solid-state disk 1200 in communication with a host 1205. The solid-state disk may comprise a controller 1210, a first solid-state nonvolatile memory 1201 and a second solid-state nonvolatile memory 1202. As an example only, the first solid-state nonvolatile memory 1201 may comprise a high endurance (i.e., high write cycle lifetime) memory device, such as a single-level cell (SLC) flash chip. The first solid-state nonvolatile memory 1201 may be more expensive and have a lower capacity (and/or density) as compared to second solid-state nonvolatile memory 1202, which may comprise a lower endurance and/or higher capacity (and/or density) memory device, such as a multi-level cell (MLC) flash chip. In this manner, solid-state disk 1200 may provide a storage system that balances endurance levels, capacity, and cost.

Controller 1210 may comprise a first memory interface 1211 and a second memory interface 1212 for interfacing with the first and second solid-state nonvolatile memories, respectively. Further, the controller 1210 may include a mapping module 1213 and a fatigue management module 1214 for mapping the logical addresses received from host 1205 to the physical addresses present in the first and second solid-state nonvolatile memories 1201, 1202. During a write operation, data from the host 1205 is written to the first solid-state nonvolatile memory 1201 via the first memory interface 1211 or to the second solid-state nonvolatile memory 1202 via the second memory interface 1212. During a read operation, data is provided to the host 1205 from the first or second solid-state nonvolatile memory 1201, 1202 via the first or second memory interface 1211, 1212, respectively.

The mapping module 1213 and fatigue management module 1214 may determine to which of the first or second solid-state nonvolatile memories 1201, 1202 a particular logical address will be mapped. Fatigue management module 1214 may also incorporate the mapping module, such that it performs the functions of both the mapping module 1213 and fatigue management module 1214. The mapping module 1213 may also include first and second wear leveling modules 1215, 1216. Alternatively, first and second wear leveling modules 1215, 1216 may be included in fatigue management module 1214, or may even be separate from mapping module 1213 and fatigue management module 1214 (not shown).

The first and second wear leveling modules 1215, 1216 may provide for independent wear leveling of actual physical addresses within each of the first and second solid-state nonvolatile memories 1201, 1202. As discussed above, the goal of the wear leveling module may be to level the wear across all the areas of its solid-state nonvolatile memory so that no one area (or physical address) wears out before the rest of the areas within the memory. An overhead area within each of the first and second solid-state nonvolatile memories 1201, 1203 may be utilized for moving data between physical addresses within a memory, which is sometimes referred to as "garbage collection."

Figure 12:
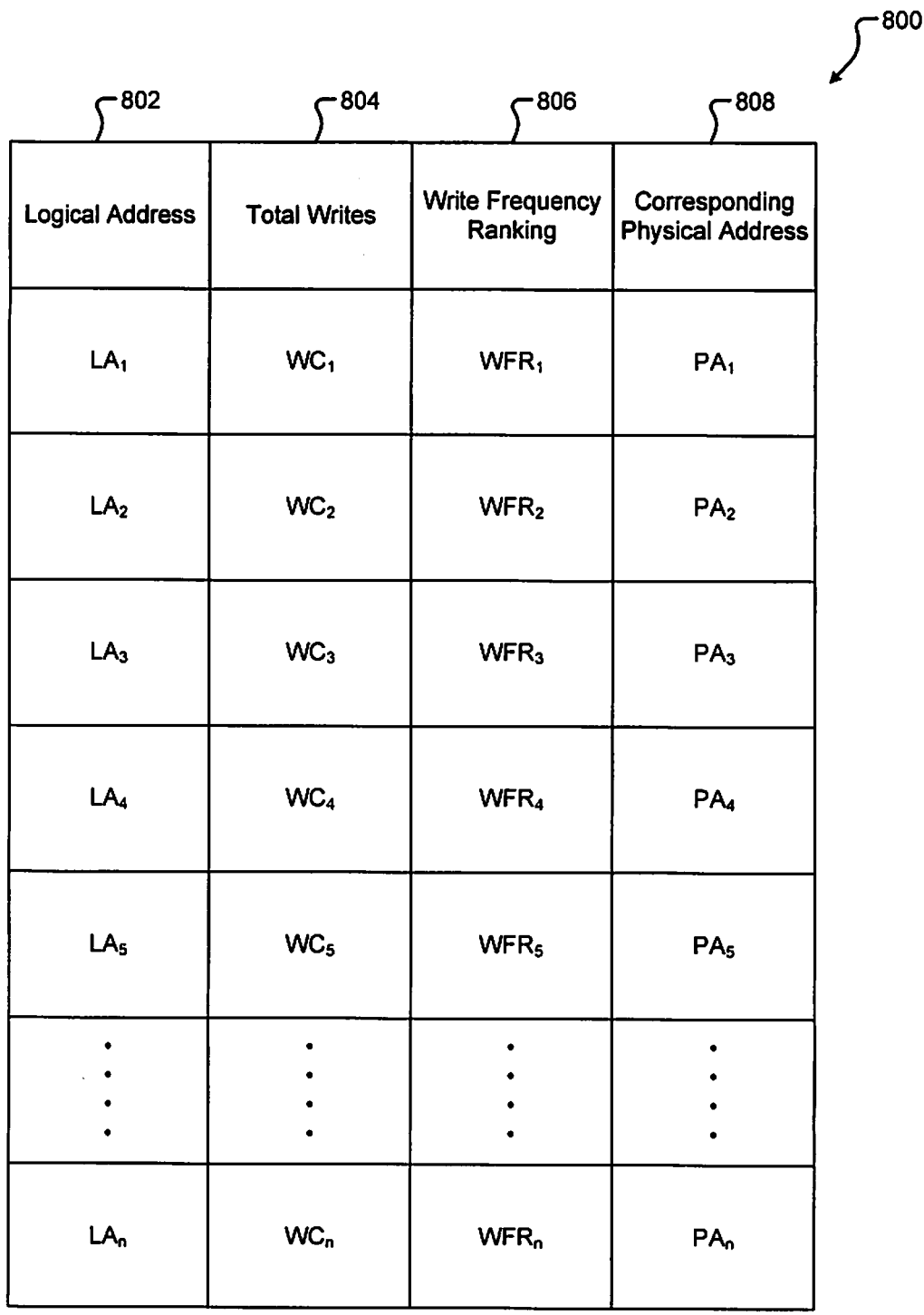
FIG. 12 is an exemplary mapping/write frequency ranking table according to the present disclosure.

Referring now to FIG. 12, an exemplary mapping/write frequency ranking table 800 according to the present disclosure is shown. The mapping/write frequency ranking table 800 comprises a list of logical addresses $LA_1$-$LA_n$ in column 802. For each logical address $LA_1$-$LA_n$, a total write count is monitored and maintained in column 804. The total write counts $WC_1$-$WC_n$ comprises the number of writes performed to the logical addresses $LA_1$-$LA_n$, respectively. At column 806, the write frequency rankings $WFR_1$-$WFR_n$ for logical addresses $LA_1$-$LA_n$, respectively, is stored. The write frequency rankings $WFR_1$-$WFR_n$ may be determined in various ways, as discussed above. The physical addresses $PA_1$-$Pa_n$ to which logical addresses $LA_1$-$LA_n$, respectively, have been mapped are stored in column 808. Columns 804-808 are updated as necessary or desirable, such that the information contained therein is accurate and/or up-to-date.

Figure 13:
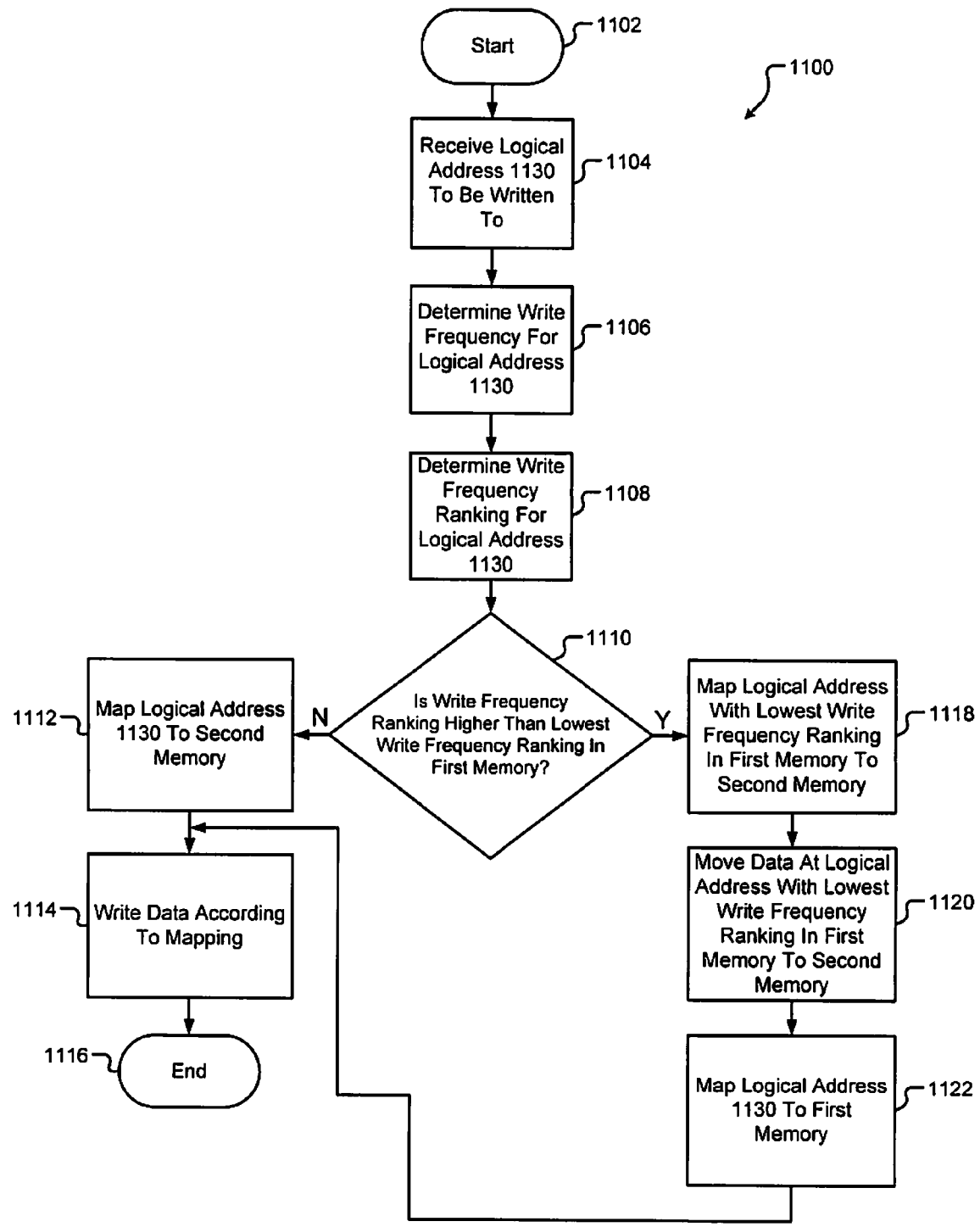
FIG. 13 is an exemplary flowchart of a method for operating the solid state disk drive of FIG. 10.

Referring now to FIG. 13, an exemplary method 1100 for managing the fatigue of a hybrid endurance solid-state storage device is shown. In this example, the first memory has a higher endurance level (or write cycle lifetime) than the second NVS memory. The method 1100 begins at step 1102. Control receives the logical address 1130 to be written to at step 1104. At step 1106, control determines the write frequency for the received logical address 1130. Based on the write frequency determination at step 1106, the write frequency ranking for that logical address 1130 is determined at 1108.

At step 1110, the write frequency ranking for the logical address 1130 to be written to is compared with the lowest write frequency ranking present in the first memory. If the write frequency ranking for the logical address 1130 is lower than the lowest write frequency ranking in the first memory, at step 1112 the logical address 1130 is mapped to the second memory. At step 1114, the data is written according to the mapping, which comprises writing the data to be written to the logical address 1130 to the second memory array. The method 1100 ends at step 1116.

If, however, the write frequency ranking for the logical address 1130 is higher than the lowest write frequency ranking in the first memory, the method passes to step 1118. At step 1118, the logical address with the lowest write frequency ranking present in the first memory is mapped instead to the second memory. At step 1120, the data present at the logical address comprising the lowest write frequency ranking in the first memory is moved to the second memory. The logical address 1130 is then mapped to the first memory at step 1122. The method 1100 then passes to step 1114, which writes data according to the mapping. The method 1100 ends at step 1116.

Those skilled in the art can now appreciate from the foregoing description that the broad teachings of the disclosure can be implemented in a variety of forms. For example, one or more steps of methods described above may be performed in a different order (or concurrently) and still achieve desirable results. Therefore, while this disclosure includes particular examples, the true scope of the disclosure should not be so limited since other modifications will become apparent to the skilled practitioner upon a study of the drawings, the specification, and the following claims.

What is claimed is:

1. A solid state memory system, comprising:
   a first nonvolatile semiconductor memory having a first write cycle lifetime and a first set of physical addresses;
   a second nonvolatile semiconductor memory having a second write cycle lifetime and a second set of physical addresses, wherein the first write cycle lifetime is greater than the second write cycle lifetime; and
   a fatigue management module configured to
      generate write frequency rankings for a plurality of logical addresses, wherein each of the write frequency rankings is based on an elapsed time since a last write cycle of a respective one of the plurality of logical addresses,
      based on the write frequency rankings, map each of the plurality of logical addresses to a physical address of the first set of physical addresses or the second set of physical addresses, and
      wherein the write frequency ranking for one of the plurality of logical addresses is based on a weighted time-decay average of write counts for the one of the plurality of logical addresses.

2. The system of claim 1, wherein the write frequency ranking for the one of the plurality of logical addresses is based on a number of write operations to the one of the plurality of logical addresses.

3. The system of claim 1, wherein the write frequency ranking for the one of the plurality of logical addresses is based on a number of write operations to the one of the plurality logical addresses during a predetermined period.

4. The system of claim 1, wherein the weighted time-decay average of write counts is based on:

$$WCA(n+1)=WCA(n)*d+WE(n)*a,$$

where
   $WCA(n)$ is a time averaged write count at timestep n,
   $WE(n)$ is an actual write event at timestep n,
   $WE(n)$ equals 1 if a write event occurred at timestep n and otherwise equals 0,
   d is a first constant, and
   a is a second constant.

5. The system of claim 4, wherein:
   the first constant d is a decay rate constant;
   the second constant a is an attack rate constant; and
   the first constant d is equal to 1 minus the second constant a.

6. The system of claim 1, further comprising a wear leveling module, wherein the wear leveling module is configured to:
   generate a first wear level for the first nonvolatile semiconductor memory based on the first write cycle lifetime; and
   generate a second wear level for the second nonvolatile semiconductor memory based on the second write cycle lifetime, and
   wherein the mapping of the plurality of logical addresses is further based on the first wear level and the second wear level.

7. The system of claim 1, wherein a lowest write frequency rating of the logical addresses mapped to the first nonvolatile semiconductor memory is greater than a highest write frequency rating of the logical addresses mapped to the second nonvolatile semiconductor memory.

8. A fatigue management method for a solid state memory system, comprising:
   providing a first nonvolatile semiconductor memory having a first write cycle lifetime and a first set of physical addresses;
   providing a second nonvolatile semiconductor memory having a second write cycle lifetime and a second set of physical addresses, wherein the first write cycle lifetime is greater than the second write cycle lifetime;
   generating write frequency rankings for a plurality of logical addresses, wherein each of the write frequency rankings is based on an elapsed time since a last write cycle of a respective one of the plurality of logical addresses; and
   based on the write frequency rankings, mapping each of the plurality of logical addresses to a physical address of the first set of physical addresses or the second set of physical addresses,
   wherein the write frequency ranking for one of the plurality of logical addresses is based on a weighted time-decay average of write counts for the one of the plurality of logical addresses.

9. The method of claim 8, wherein the write frequency ranking for the one of the plurality of logical addresses is based on a number of write operations to the one of the plurality of logical addresses.

10. The method of claim 8, wherein the write frequency ranking for the one of the plurality of logical addresses is based on a number of write operations to the one of the plurality logical addresses during a predetermined period.

11. The method of claim 8, wherein the time averaged write count is based on:

$$WCA(n+1)=WCA(n)*d+WE(n)*a,$$

where
- $WCA(n)$ is a time averaged write count at timestep n,
- $WE(n)$ is an actual write event at timestep n,
- $WE(n)$ equals 1 if a write event occurred at timestep n and otherwise equals 0,
- d is a first constant, and
- a is a second constant.

12. The method of claim 8, further comprising:
   generating a first wear level for the first nonvolatile semiconductor memory based on the first write cycle lifetime; and
   generating a second wear level for the second nonvolatile semiconductor memory based on the second write cycle lifetime,
   wherein the mapping of the plurality of logical addresses is further based on the first wear level and the second wear level.

13. The method of claim 8, wherein a lowest write frequency rating of the logical addresses mapped to the first nonvolatile semiconductor memory is greater than a highest write frequency rating of the logical addresses mapped to the second nonvolatile semiconductor memory.

14. A solid state memory system, comprising:
   a first nonvolatile semiconductor memory having a first write cycle lifetime and a first set of physical addresses;
   a second nonvolatile semiconductor memory having a second write cycle lifetime and a second set of physical addresses, wherein the first write cycle lifetime is greater than the second write cycle lifetime; and
   a fatigue management module configured to
      generate write frequency rankings for a plurality of logical addresses, wherein each of the write frequency rankings is based on an elapsed time since a last write cycle of a respective one of the plurality of logical addresses, and
      based on the write frequency rankings, map each of the plurality of logical addresses to a physical address of the first set of physical addresses or the second set of physical addresses,
   wherein each of the write frequency rankings is based on averages of elapsed times between write cycles of a respective one of the plurality of logical addresses.

15. A solid state memory system, comprising:
   a first nonvolatile semiconductor memory having a first write cycle lifetime and a first set of physical addresses;
   a second nonvolatile semiconductor memory having a second write cycle lifetime and a second set of physical addresses, wherein the first write cycle lifetime is greater than the second write cycle lifetime; and
   a fatigue management module configured to
      generate write frequency rankings for a plurality of logical addresses, wherein each of the write frequency rankings is based on an average of elapsed time between write cycles for a respective one of the plurality of logical addresses,
      based on the write frequency rankings, map each of the plurality of logical addresses to a physical address of the first set of physical addresses or the second set of physical addresses, and
      normalize the averages of the elapsed times between the write cycles of the plurality of logical addresses based on the first write cycle lifetime and the second write cycle lifetime.

* * * * *